United States Patent

Huang et al.

(10) Patent No.: US 8,959,460 B1
(45) Date of Patent: Feb. 17, 2015

(54) LAYOUT DECOMPOSITION METHOD

(71) Applicant: Taiwan Semiconductor Manufacturing Company, Ltd., Hsinchu (TW)

(72) Inventors: Wen-Chun Huang, Tainan (TW); Ming-Hui Chih, Luzho (TW); Chia-Ping Chiang, Taipei (TW); Ru-Gun Liu, Zhubei (TW); Tsai-Sheng Gau, Hsinchu (TW); Jia-Guei Jou, New Taipei (TW); Chih-Chung Huang, Hsinchu (TW); Dong-Hsu Cheng, Tainan (TW); Yung-Pei Chin, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/955,700

(22) Filed: Jul. 31, 2013

(51) Int. Cl.
*G06F 17/50* (2006.01)

(52) U.S. Cl.
CPC .................................. *G06F 17/5072* (2013.01)
USPC ................. 716/50; 716/51; 716/55; 716/110; 716/111; 716/132

(58) Field of Classification Search
CPC ......... G03F 1/36; G03F 7/70; G06F 17/5068; G06F 17/5072; G06F 17/5081
USPC ...................................... 716/50–56, 110, 132
See application file for complete search history.

(56) References Cited

U.S. PATENT DOCUMENTS

| 8,042,069 B2* | 10/2011 | Yang et al. ...................... 716/55 |
| 2011/0197168 A1* | 8/2011 | Chen et al. ..................... 716/50 |

\* cited by examiner

*Primary Examiner* — Paul Dinh
(74) *Attorney, Agent, or Firm* — Lowe Hauptman & Ham, LLP

(57) ABSTRACT

A method of assigning layout patterns includes identifying a first set of layout patterns of a current layout design that is new or has been modified in comparison with a reference layout design. A second set of layout patterns of the current layout design is identified. A member of the second set of layout patterns that is not a member of the first set of layout patterns has a distance, less than a predetermined threshold distance, to at least another member of the second set of layout patterns. A third set of layout patterns is not modified in comparison with the reference layout design. The third set of layout patterns is assigned to a plurality of masks according to the reference pattern-assigning result.

20 Claims, 4 Drawing Sheets

LAYOUT DECOMPOSITION METHOD

BACKGROUND

In semiconductor fabrication processes, a single layer of features is sometimes formed by using multiple-exposure or multiple-patterning to improve a spatial resolution of the particular layer. For example, in a method known as double patterning technology (DPT), layout patterns corresponding to a layout design for a particular layer of features are assigned to two different masks. The pattern-assigning process is sometimes also referred to as a "layout decomposition process," and the pattern-assigning result is sometimes also referred to as a "layout decomposition result." Performance of a pattern-assigning process on a layout design is usually computational resource demanding and time consuming.

DESCRIPTION OF THE DRAWINGS

One or more embodiments are illustrated by way of example, and not by limitation, in the figures of the accompanying drawings, wherein elements having the same reference numeral designations represent like elements.

DETAILED DESCRIPTION

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In some applications, a current layout design is modified from a reference layout design. In some embodiments, a layout decomposition process (also referred to as pattern-assigning process) for the current layout design according to this disclosure is performed by taking a reference pattern-assigning result of the reference layout design into consideration. One of many advantages of a method according to the present disclosure is to reduce the number of layout patterns to be processed by performing a pattern-assigning process. Therefore, the computational resources and/or processing time for a method according to the present disclosure are less than that for a layout decomposition process performed without referring to the reference pattern-assigning result. Another one of many advantages of a method according to the present disclosure is to minimize the difference between layout decomposition results of the current layout design and the reference layout design. Therefore, the manufacturing of an integrated circuit based on the resulting masks of the current layout design is more likely to have consistent performance and yield rate as that based on the reference layout design.

Figure 1:
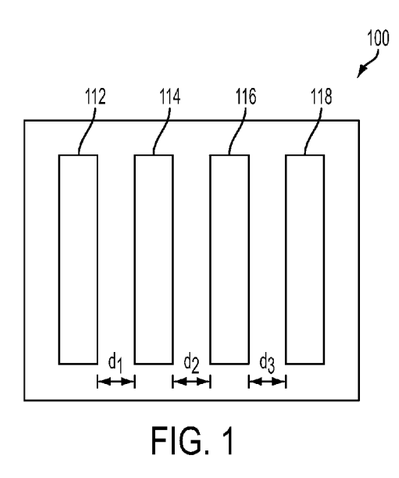
FIG. 1 is a two-dimensional diagram of a layout design of a particular layer of features of an integrated circuit in accordance with one or more embodiments.

FIG. 1 is a two-dimensional diagram of a layout design 100 of a particular layer of features of an integrated circuit in accordance with one or more embodiments. The integrated circuit has many layers of features, such as active regions, doped regions, conductive structures, spacers, or other similar elements. These features are formed based on many corresponding layout designs, and each layout design includes many corresponding layout patterns. Layout design 100 has four layout patterns 112, 114, 116, and 118. The layout patterns 112, 114, 116, and 118 and layout design 100 are provided as a simplified example. A person having ordinary skill in the art would appreciate that many other layout designs and various layout patterns with different sizes and shapes would be usable to manufacture the integrated circuit.

Layout design 100 is depicted in FIG. 1 as a two-dimensional diagram. In some embodiments, layout design 100 is stored in a non-transitory storage device in a database file format, e.g., GRAPHIC DATA SYSTEM (GDS II), OPEN ARTWORK SYSTEM INTERCHANGE STANDARD (OASIS), or other suitable formats.

For a predetermined manufacturing process, a minimum threshold distance between any two layout patterns that can be placed on the same mask is defined in order to ensure that the formation of the features according to the mask is within the capability of the predetermined manufacturing process. In some embodiments, the minimum threshold distance is determined according to one or more factors including a wavelength of an electromagnetic wave used in a photolithography process of the predetermined manufacturing process; a numerical aperture of a lens used in the photolithography process; and/or other fabrication process parameters, such as fabrication cost, acceptable deviation, semiconductor fabrication tool limitations, yield rate, or other suitable parameters.

For example, layout pattern 112 is separated from layout pattern 114 by a distance d1; layout pattern 114 is separated from layout pattern 116 by a distance d2; and layout pattern 116 is separated from layout pattern 118 by a distance d3. In the embodiment depicted in FIG. 1, all distances d1, d2, and d3 are less than the predetermined minimum threshold distance. Therefore, in order to properly fabricate the features on the integrated circuits according to the layout design 100, multiple-patterning technology is adopted and layout patterns 112, 114, 116, and 118 are thus assigned to different masks.

Figure 2A:
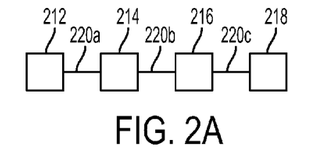
FIG. 2A is a graphic node diagram of layout patterns of the layout design of FIG. 1 in accordance with one or more embodiments.

FIG. 2A is a graphic node diagram of layout patterns of the layout design 100 of FIG. 1 in accordance with one or more embodiments. Layout patterns 112, 114, 116, and 118 in FIG. 1 are represented by corresponding nodes 212, 214, 216, and 218. Nodes 212 and 214 are linked by a connector 220a; nodes 214 and 216 are linked by a connector 220b; and nodes 216 and 218 are linked by a connector 220c. Having two nodes connected by a connector in FIG. 2A represents that a distance between the corresponding layout patterns is less than the predetermined threshold distance. In some applications, the connectors 220a-220c are also referred to as "G0-space," and a network of interconnected nodes and connectors, such as the network depicted in FIG. 2A, is also referred to as a "G0-path" or "G0-network." Because the nodes in a G0-network are connected by G0-space, each corresponding layout pattern in a given G0-network has a G0-space (i.e., a distance less than the predetermined threshold distance) to at least another corresponding layout pattern in the same G0-network.

Figure 2B:
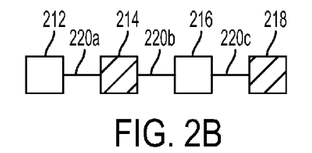
FIG. 2B is a graphic node diagram of layout patterns of the layout design of FIG. 1, after a pattern-assigning process has been performed, in accordance with one or more embodiments.

FIG. 2B is a graphic node diagram of layout patterns of the layout design 100 of FIG. 1, after a pattern-assigning process has been performed, in accordance with one or more embodiments. After representing a layout design using a graphic node diagram, a pattern-assigning process resembles a coloring problem in graph theory. Depending on a number N of masks to which the layout design 100 will be assigned, an algorithm based on N-coloring problem in graphic theory is usable for the pattern-assigning process. In some embodiments, N is an integer not less than 2. Nodes in a G0-space network having the same color means that corresponding layout patterns are assigned to the same mask. For example, a 2-coloring process is performed for assigning layout patterns of layout design 100.

Figure 3A:
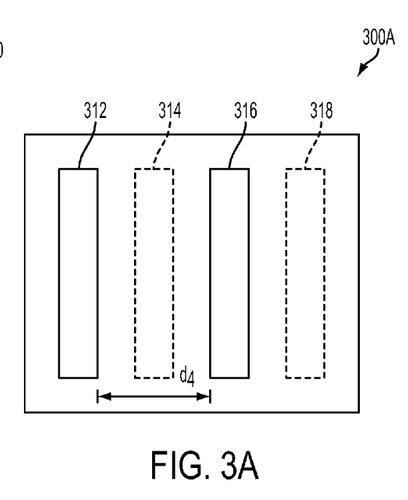
FIG. 3A is a top view of a first mask including a first set of layout patterns from the layout design of FIG. 1 in accordance with one or more embodiments.
Figure 3B:
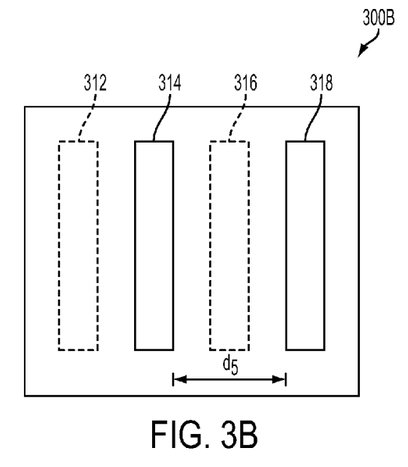
FIG. 3B is a top view of a second mask including a second set of layout patterns from the layout design of FIG. 1 in accordance with one or more embodiments.

FIG. 3A is a top view of a first mask 300A including a first set of layout patterns 312 and 316 from the layout design 100 of FIG. 1 in accordance with one or more embodiments. FIG. 3B is a top view of a second mask 300B including a second set of layout patterns 314 and 318 from the layout design 100 of FIG. 1 in accordance with one or more embodiments.

As depicted in FIG. 2B, nodes 212 and 216 are assigned a first color (i.e., corresponding to the first mask 300A), and nodes 214 and 218 are assigned a second color (i.e., corresponding to the second mask 300B). Layout patterns 312, 314, 316, and 318 correspond to nodes 212, 214, 216, and 218. Based on the pattern-assigning result as depicted in FIG. 2B, layout patterns 112, 114, 116, and 118 are assigned to two different masks 300A and 300B.

On mask 300A, there are no layout patterns corresponding to layout patterns 314 and 318, and layout patterns 312 and 316 are separated by a distance d4. Also, on mask 300B, there are no layout patterns corresponding to layout patterns 312 and 316, and layout patterns 314 and 318 are separated by a distance d5. Distances d4 and d5 are not less than the predetermined threshold distance, and thus the formation of features based on either mask 300A or mask 300B is within the capability of the predetermined manufacturing process. Accordingly, by partially or entirely repeating the predetermined manufacturing process using mask 300A and mask 300B individually, features of the integrated circuit defined by layout design 100 are thus formed. In some embodiments, layout patterns of a layout design are assigned to more than two different masks.

Figure 4:
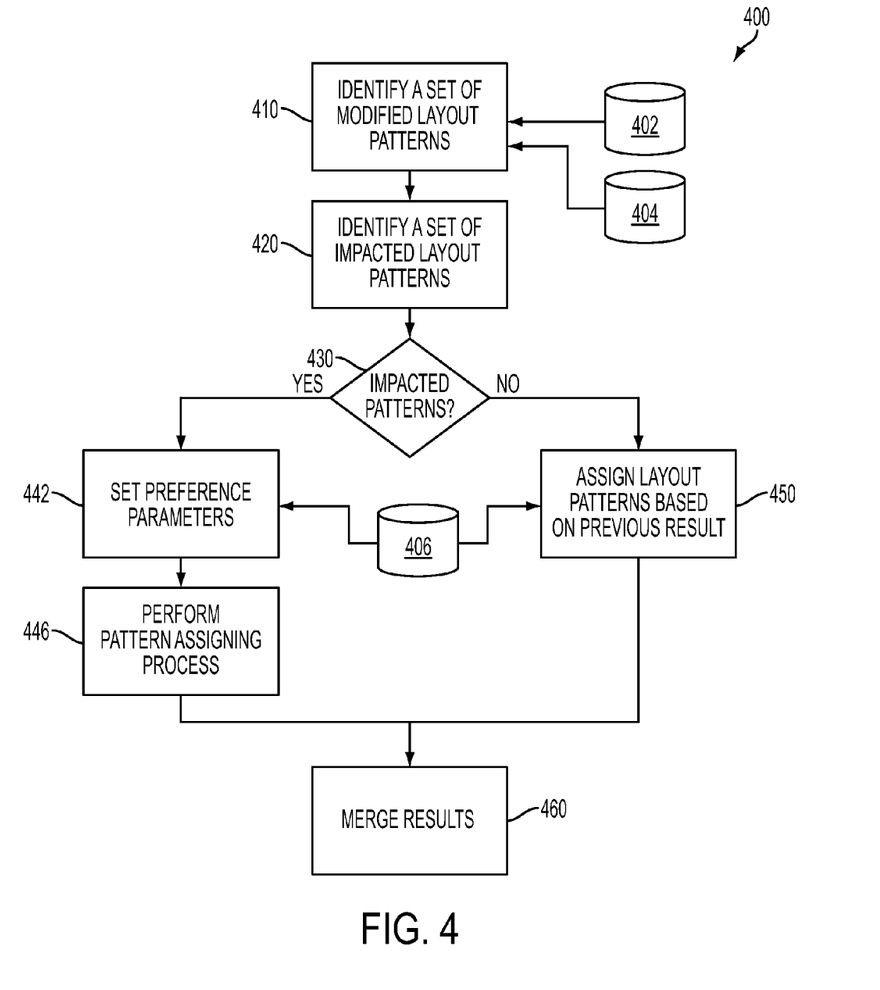
FIG. 4 is a flowchart of a method of assigning layout patterns to various masks in accordance with one or more embodiments.

FIG. 4 is a flowchart of a method of assigning layout patterns to various masks in accordance with one or more embodiments. It is understood that additional operations may be performed before, during, and/or after the method 400 depicted in FIG. 4, and that some other processes may only be briefly described herein.

In some embodiments, a current layout design 402 is based on modifying a reference layout design 404. In some applications, the reference layout design has been processed to have a reference pattern-assigning result 406. In some embodiments, the reference pattern-assigning result 406 has been used to implement masks that were actually put in use to manufacture features of an integrated circuit using a predetermined manufacturing process. Thus, in many cases the reference pattern-assigning result has been verified or fine-tuned to ensure the performance and yield of manufacturing the integrated circuit. It is observed by the Applicant that the smaller the difference between layout decomposition results of the current layout design 402 and the reference layout design 404, the more likely that an integrated circuit manufactured based on the resulting masks of the current layout design 402 has consistent performance and yield rate as that based on the reference layout design. Also, in some embodiments, partially adopting the reference pattern-assigning result 406 when performing the pattern-assigning process on the current layout design 402 reduces the number of layout patterns that need to be analyzed, and thus in turn reduces computational resources and/or processing time for layout decomposition.

Figure 5A:
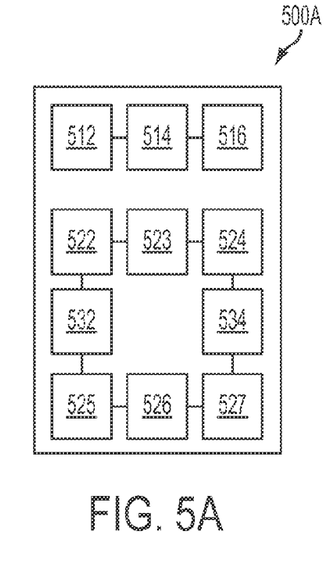
FIG. 5A is a graphic node diagram of layout patterns of a reference layout design in accordance with one or more embodiments.
Figure 5B:
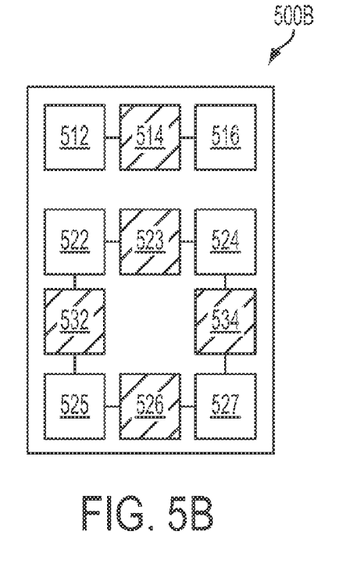
FIG. 5B is a graphic node diagram of a pattern-assigning result of the reference layout design in FIG. 5A in accordance with one or more embodiments.

The flowchart 400 will be explained using FIGS. 5A-6B as an example. FIG. 5A is a graphic node diagram of layout patterns of a reference layout design 500A (usable as a reference layout design 404), and FIG. 5B is a graphic node diagram of a reference pattern-assigning result 500B (usable as a reference pattern-assigning result 406) of the reference layout design in FIG. 5A, in accordance with one or more embodiments. The graphic node diagram in FIG. 5A includes nodes 512, 514, 516, 522-527, 532, and 534 representing corresponding layout patterns of layout design 500A. Therefore, nodes 512, 514, 516, 522-527, 532, and 534 are also referred to as layout patterns 512, 514, 516, 522-527, 532, and 534 in this disclosure. Layout patterns 512, 514, and 516 are interconnected by a first set of G0-spaces, and layout patterns 522-527, 532, and 534 are interconnected by a second set of G0-spaces.

Figure 6A:
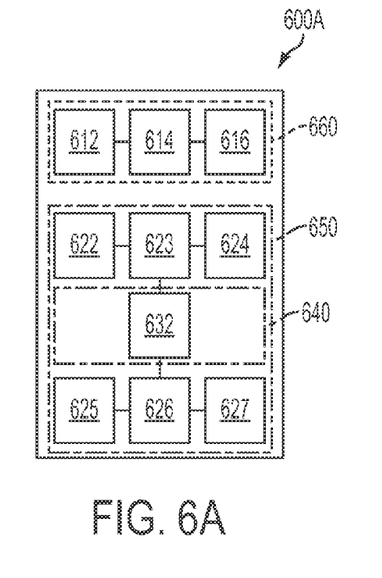
FIG. 6A is a graphic node diagram of layout patterns of a current layout design in accordance with one or more embodiments.
Figure 6B:
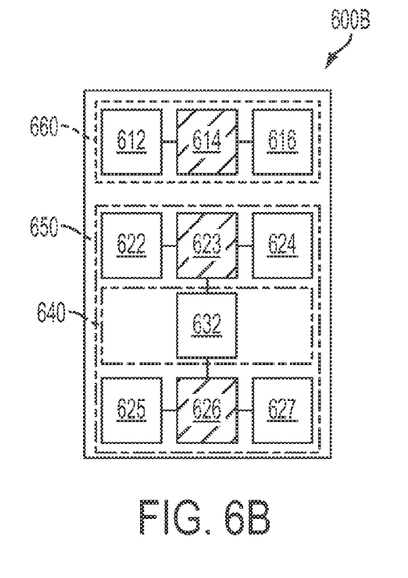
FIG. 6B is a graphic node diagram of a pattern-assigning result of the layout design in FIG. 6A in accordance with one or more embodiments.

FIG. 6A is a graphic node diagram of layout patterns of a current layout design 600A, and FIG. 6B is a graphic node diagram of a layout-assigning result 600B of the layout design in FIG. 6A, in accordance with one or more embodiments. Graphic node diagram in FIG. 6A includes nodes 612, 614, 616, 622-627, and 632 representing corresponding layout patterns of layout design 600A. Therefore, nodes 612, 614, 616, 622-627, and 632 are also referred to as layout patterns 612, 614, 616, 622-627, and 632 in this disclosure. Layout patterns 612, 614, and 616 are interconnected by a third set of G0-spaces, and layout patterns 622-627 and 632 are interconnected by a fourth set of G0-spaces. The layout design 600A is usable as the current layout design 402.

As depicted in FIGS. 4, 5A, and 6A, in operation 410, a set of modified layout patterns 640 among the layout patterns is identified. The identified set of modified layout patterns 640 includes one or more layout patterns (such as layout pattern 632) that are new or have been modified in comparison with reference layout design 500A. For example, layout pattern 632 is new, and layout patterns 622-627 are identical to corresponding layout patterns 522-527. In some embodiments, a layout pattern of a current layout design is considered "modified" if, in comparison with the corresponding location or corresponding layout pattern in the reference layout design, the layout pattern of the current layout design is resized, shifted, or newly created. In some embodiments, operation 410 is performed by executing an Exclusive OR (XOR) on the current and reference layout design. In some embodiments, if a layout pattern in the reference layout design does not have a counterpart in the current layout design, a temporary modified node corresponding to the removed layout pattern is added to the set of modified layout patterns. The temporary modified node is usable for identifying an impacted region in operation 420 and is not "colored." In some embodiments, removed layout patterns are not considered a "modified layout pattern" for the purpose of operations 410 and 420.

As depicted in FIGS. 4, 5A, and 6A, in operation 420, a set of impacted layout patterns 650 among the layout patterns is identified. The identified set of impacted layout patterns 650 includes at least the set of modified layout patterns 640. Further, identified the set of impacted layout patterns 650 includes layout patterns that belong to the same GO-network(s) as members (layout patterns) of the set of modified layout patterns 640. As described above, in some embodiments, the set of modified layout patterns 640 includes temporary modified node(s) that will be omitted during pattern-assigning process. Therefore, any member of the set of impacted layout patterns 650 that is not a member of the set of modified layout patterns 640 has a distance, which is less than a predetermined threshold distance, to at least another member of the set of impacted layout patterns 650.

As depicted in FIG. 4, in operation 430, layout patterns of a layout design 600A are processed depending on if the layout patterns belong to a set of impacted layout patterns identified in operation 420. For layout patterns of the set of impacted layout patterns, a pattern-assigning process is performed by taking a process path including operations 442 and 446. Otherwise, a pattern-assigning process of one or more non-impacted layout patterns is performed by taking a process path including operation 450.

As depicted in FIGS. 4, 5B, and 6A, in operation 442, for the set of impacted layout patterns, one or more preference parameters for a subset of the set of impacted patterns are set according to the reference pattern-assigning result 406 (such as pattern-assigning result 500B) corresponding to the reference layout design 404 (such as layout design 500A). In some embodiments, the subset of layout patterns is complement of the set of modified layout patterns 640 in the set of impacted layout patterns 650.

For example, in the embodiment depicted in FIG. 6A, the subset of layout patterns include layout patterns 622-627. Compared with corresponding layout patterns 522-527 in the reference layout design 500A, layout patterns 622-627 have not been changed. However, layout patterns 622-627 and modified layout pattern 632 are in the same GO-network (i.e., the set of impacted layout patterns 650). Therefore, in operation 442, one or more preference parameters for layout patterns 622-627 are set according to the pattern-assigning result of layout patterns 522-527 depicted in FIG. 5B.

As depicted in FIGS. 4, 5B, and 6B, in operation 446, a predetermined pattern-assigning process is performed on the set of impacted layout patterns 650 according to the one or more preference parameters set during operation 442. In some embodiments, the predetermined pattern-assigning process is performed in a manner that a smallest distance between any two layout patterns assigned to the same one of a plurality of masks is not less than the predetermined threshold distance.

In some embodiments, the predetermined pattern-assigning process assigns the layout patterns 622-627 and 632 of the set of impacted layout patterns 650 to a predetermined number of masks by calculating a cost function and attempting to keep an outcome value of the cost function to a minimum for tentative pattern-assigning results. In some embodiments, the cost function is formulated in order to minimize design rule violation, to minimize the number of cut layout patterns, to maximize average distances within a mask, or similar formulations. In some embodiments, the one or more preference parameters for the subset of layout patterns set during operation 442 correspond to weights, usable when performing the predetermined pattern-assigning process in operation 446. In some embodiments, the one or more preference parameters imposes penalties to the outcome value of the cost function if the layout patterns 622-627 are not assigned corresponding color(s) the same as that of corresponding layout patterns 522-527 of layout design 500A whenever feasible.

In the embodiment depicted in FIGS. 5B and 6B, layout patterns 622, 624, 625, and 627 are assigned a first color the same as the corresponding layout patterns 522, 524, 525, and 527; and layout patterns 623 and 626 are assigned a second color the same as the corresponding layout patterns 523 and 526. Layout pattern 632 is assigned the first color.

In some embodiments, operation 446 also includes performing an analysis to determine if the set of impacted layout patterns is suitable for being assigned to the predetermined number of masks, or sometimes being referred to as "colorable" for the predetermined number of masks. In some embodiments, operation 446 also includes reforming layout patterns in order to render layout design 600A "colorable." In at least one embodiment, the reformation of layout patterns including cutting layout patterns and stitching cut layout patterns. The embodiment depicted in FIGS. 6A and 6B, the GO-network of the set of impacted patterns 650 is "2-colorable."

As described above, in some embodiments, temporary modified node(s), if any, are removed or omitted for the purposes of operations 442 and 446.

As depicted in FIGS. 4, 5B, and 6B, in operation 450, a set of layout patterns 660, including layout patterns 612, 614, and 616, that is not modified in comparison with the reference layout design 500A is assigned to the plurality of masks according to the reference pattern-assigning result 500B. In some embodiments, the set of layout patterns 660 is complement of the set of impacted layout patterns 650 among the layout patterns of the current layout design 600A. In some embodiments, the set of layout patterns 660 is assigned to the plurality of masks (i.e., colors) identical to the reference pattern-assigning result 500B of corresponding layout patterns of the reference layout design 500A. For example, in the embodiment depicted in FIG. 6B, a first color is assigned to layout patterns 612 and 616, and a second color is assigned to layout pattern 614.

Figure 7:
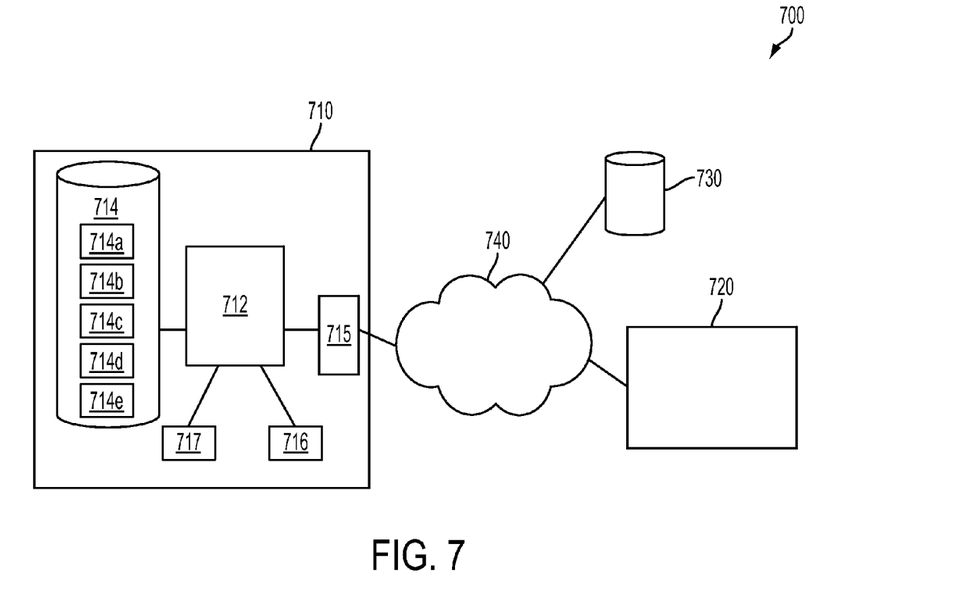
FIG. 7 is a functional block diagram of an integrated circuit designing system in accordance with one or more embodiments.

As depicted in FIGS. 4 and 6B, in operation 460, the pattern-assigning results from operation 446 and operation 450 are merged to become the pattern-assigning result 600B (e.g., element 714d in FIG. 7).

FIG. 7 is a functional block diagram of an integrated circuit designing system in accordance with one or more embodiments. Integrated circuit designing system 700 includes a first computer system 710, a second computer system 720, a networked storage device 730, and a network 740 connecting the first computer system 710, the second computer system 720, and the networked storage device 730. In some embodiments, one or more of the second computer system 720, the storage device 730, and the network 740 are omitted.

The first computer system 710 includes a hardware processor 712 communicatively coupled with a non-transitory, computer readable storage medium 714 encoded with, i.e., storing, a reference layout design 714a (e.g., element 404 in FIG. 4), a reference pattern-assigning result 714b (e.g., element 406 in FIG. 4), a current layout design 714c (e.g., element 402 in FIG. 4), a current pattern-assigning result 714d, and/or a computer program code 714e, i.e., a set of executable instructions. The processor 712 is electrically and communicatively coupled with the computer readable storage medium 714. The processor 712 is configured to execute a set of instructions 714e encoded in the computer readable storage medium 714 in order to cause the computer 710 to be usable as a placing and routing tool for performing a layout decomposition process as described in conjunction with FIG. 4. In some embodiments, a set of instructions 714e constitutes a stand-alone application program or a portion of a Design Rule Check (DRC) application program.

In some embodiments, one or more of the reference layout design 714a, the reference pattern-assigning result 714b, the current layout design 714c, and a current pattern-assigning result 714d are stored in a non-transitory storage medium other than storage medium 714. In some embodiments, some or all of layout designs 714a/714c and pattern-assigning results 714b/714d are stored in a non-transitory storage medium in networked storage device 730 or second computer system 720. In such case, some or all of layout designs 714a/714c and pattern-assigning results 714b/714d stored outside computer 710 is accessible by the processor 712 through the network 740.

In some embodiments, the processor 712 is a central processing unit (CPU), a multi-processor, a distributed processing system, an application specific integrated circuit (ASIC), and/or a suitable processing unit.

In some embodiments, the computer readable storage medium 714 is an electronic, magnetic, optical, electromagnetic, infrared, and/or a semiconductor system (or apparatus or device). For example, the computer readable storage medium 714 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 714 includes a compact disk-read only memory (CD-ROM), a compact disk-read/write (CD-R/W), and/or a digital video disc (DVD).

The computer system 710 includes, in at least some embodiments, an input/output interface 716 and a display unit 717. The input/output interface 716 is coupled to the controller 712 and allows the circuit designer to manipulate the first computer system 710. In at least some embodiments, the display unit 717 displays the status of executing the set of instructions 714d in a real-time manner and preferably provides a Graphical User Interface (GUI). In at least some embodiments, the input/output interface 716 and the display 717 allow an operator to operate the computer system 710 in an interactive manner.

In accordance with one embodiment, a method of assigning layout patterns includes identifying a first set of layout patterns of a current layout design that is new or has been modified in comparison with a reference layout design. A second set of layout patterns of the current layout design is identified. A member of the second set of layout patterns that is not a member of the first set of layout patterns has a distance, less than a predetermined threshold distance, to at least another member of the second set of layout patterns. A third set of layout patterns is not modified in comparison with the reference layout design. The third set of layout patterns is assigned to a plurality of masks according to the reference pattern-assigning result.

In accordance with another embodiment, an integrated circuit designing system includes a non-transitory storage medium encoded with a set of instructions and a hardware processor communicatively coupled with the non-transitory storage medium. The hardware processor is configured to execute the set of instruction to: identify a first set of layout patterns of a current layout design that is new or has been modified in comparison with a reference layout design; to identify a second set of layout patterns of the current layout design; and to assign a third set of layout patterns among the layout patterns of the current layout design to a plurality of masks according to the reference pattern-assigning result. The second set of layout patterns includes the first set of layout patterns, and a member of the second set of layout patterns that is not a member of the first set of layout patterns has a distance, less than a predetermined threshold distance, to at least another member of the second set of layout patterns. The third set of layout patterns is not modified in comparison with the reference layout design.

In accordance with another embodiment, a non-transitory storage medium encoded with a set of instructions. The set of instructions is configured to cause a hardware processor to perform a method including: identifying a first set of layout patterns among layout patterns of a current layout design that is new or has been modified in comparison with a reference layout design; identifying a second set of layout patterns among the layout patterns of the current layout design; and assigning a third set of layout patterns among the layout patterns of the current layout design to a plurality of masks according to the reference pattern-assigning result. The second set of layout patterns includes the first set of layout patterns, and a member of the second set of layout patterns that is not a member of the first set of layout patterns has a distance, less than a predetermined threshold distance, to at least another member of the second set of layout patterns. The third set of layout patterns is not modified in comparison with the reference layout design.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of assigning layout patterns of a current layout design for an integrated circuit to a plurality of masks, the method comprising:
   identifying a first set of layout patterns among the layout patterns of the current layout design that is new or has been modified in comparison with a reference layout design;
   identifying a second set of layout patterns among the layout patterns of the current layout design, the second set of layout patterns including the first set of layout patterns and wherein a member of the second set of layout patterns that is not a member of the first set of layout patterns has a distance, less than a predetermined threshold distance, to at least another member of the second set of layout patterns; and assigning a third set of layout patterns among the layout patterns of the current layout design to the plurality of masks according to a reference pattern-assigning result of the reference layout design, the third set of layout patterns being not modified in comparison with the reference layout design, wherein at least one of the identifying a first set, identifying a second set, or assigning a third set is performed by using a hardware processor.

2. The method of claim 1, further comprising:

setting one or more preference parameters for a fourth set of layout patterns among the layout patterns of the current layout design according to a reference pattern-assigning result corresponding to the reference layout design, the fourth set of layout patterns being a complement of the first set of layout patterns in the second set of layout patterns.

3. The method of claim 1, further comprising:

performing a predetermined pattern-assigning process to assign the second set of layout patterns to the plurality of masks according to the one or more preference parameters for the fourth set of layout patterns.

4. The method of claim 3, wherein the predetermined pattern-assigning process comprises calculating a cost function, and the one or more preference parameters for the fourth set of layout patterns function to impose a penalty to an outcome value of the cost function if a layout pattern of the fourth set of layout patterns is not assigned the same as a corresponding layout pattern in the reference pattern-assigning result of the reference layout design.

5. The method of claim 3, wherein the predetermined pattern-assigning process is performed in a manner that a smallest distance between any two layout patterns assigned to one of the plurality of masks is not less than the predetermined threshold distance.

6. The method of claim 1, wherein the third set of layout patterns is a complement of the second set of layout patterns among the layout patterns of the current layout design.

7. The method of claim 1, wherein the assigning the third set of layout patterns comprises:

assigning the third set of layout patterns to the plurality of masks identical to the reference pattern-assigning result of corresponding layout patterns of the reference layout design.

8. The method of claim 1, further comprising:

creating a temporary modified node representing a removed layout pattern in comparison with the reference layout design; and including the temporary modified node as a member of the first set of layout patterns.

9. An integrated circuit designing system, comprising:

a non-transitory storage medium encoded with a set of instructions;

a hardware processor communicatively coupled with the non-transitory storage medium and configured to execute the set of instructions to:

identify a first set of layout patterns among layout patterns of a current layout design that is new or has been modified in comparison with a reference layout design;

identify a second set of layout patterns among the layout patterns of the current layout design, the second set of layout patterns including the first set of layout patterns and wherein a member of the second set of layout patterns that is not a member of the first set of layout patterns has a distance, less than a predetermined threshold distance, to at least another member of the second set of layout patterns; and assign a third set of layout patterns among the layout patterns of the current layout design to a plurality of masks according to a reference pattern-assigning result of the reference layout design, the third set of layout patterns being not modified in comparison with the reference layout design.

10. The integrated circuit designing system of claim 9, wherein the hardware processor, when executing the set of instructions, is further configured to:

set preference parameters for a fourth set of layout patterns among the layout patterns of the current layout design according to a reference pattern-assigning result corresponding to the reference layout design, the fourth set of layout patterns being a complement of the first set of layout patterns in the second set of layout patterns.

11. The integrated circuit designing system of claim 10, wherein the hardware processor, when executing the set of instructions, is further configured to:

perform a predetermined pattern-assigning process to assign the second set of layout patterns to the plurality of masks according to the one or more preference parameters for the fourth set of layout patterns.

12. The integrated circuit designing system of claim 11, wherein the predetermined pattern-assigning process comprises calculating a cost function, and the one or more preference parameters for the fourth set of layout patterns function to impose a penalty to an outcome value of the cost function if a layout pattern of the fourth set of layout patterns is not assigned the same as a corresponding layout pattern in the reference layout design.

13. The integrated circuit designing system of claim 11, wherein the predetermined pattern-assigning process is performed in a manner that a smallest distance between any two layout patterns assigned to one of the plurality of masks is not less than the predetermined threshold distance.

14. The integrated circuit designing system of claim 9, wherein the assigning the third set of layout patterns comprises:

assigning the third set of layout patterns to the plurality of masks identical to the reference pattern-assigning result of corresponding layout patterns of the reference layout design.

15. A non-transitory storage medium encoded with a set of instructions, the set of instructions is configured to cause a hardware processor to perform a method comprising:

identifying a first set of layout patterns among layout patterns of a current layout design that is new or has been modified in comparison with a reference layout design;

identifying a second set of layout patterns among the layout patterns of the current layout design, the second set of layout patterns including the first set of layout patterns and wherein a member of the second set of layout patterns that is not a member of the first set of layout patterns has a distance, less than a predetermined threshold distance, to at least another member of the second set of layout patterns; and assigning a third set of layout patterns among the layout patterns of the current layout design to a plurality of masks according to a reference pattern-assigning result of the reference layout design, the third set of layout patterns not being modified in comparison with the reference layout design.

16. The non-transitory storage medium of claim 15, wherein the set of instructions are configured to cause the hardware processor to perform the method further comprising:

setting one or more preference parameters for a fourth set of layout patterns among the layout patterns of the current layout design according to a reference pattern-assigning result corresponding to the reference layout design, the fourth set of layout patterns being a complement of the first set of layout patterns in the second set of layout patterns.

17. The non-transitory storage medium of claim 16, wherein the set of instructions are configured to cause the hardware processor to perform the method further comprising:

performing a predetermined pattern-assigning process to assign the second set of layout patterns to the plurality of masks according to the one or more preference parameters for the fourth set of layout patterns.

18. The non-transitory storage medium of claim 17, wherein the predetermined pattern-assigning process comprises calculating a cost function, and the one or more preference parameters for the fourth set of layout patterns function to impose a penalty to an outcome value of the cost function if a layout pattern of the fourth set of layout patterns is not assigned the same as a corresponding layout pattern in the reference layout design.

19. The non-transitory storage medium of claim 17, wherein the set of instructions are configured to cause the hardware processor to perform the predetermined pattern-assigning process in a manner that a smallest distance between any two layout patterns assigned to one of the plurality of masks is not less than the predetermined threshold distance.

20. The non-transitory storage medium of claim 15, wherein the assigning the third set of layout patterns comprises:

assigning the third set of layout patterns to the plurality of masks identical to the reference pattern-assigning result of corresponding layout patterns of the reference layout design.

* * * * *